United States Patent
Bae

(10) Patent No.: US 9,926,625 B2
(45) Date of Patent: Mar. 27, 2018

(54) DEPOSITION APPARATUS

(75) Inventor: Heung Teak Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 552 days.

(21) Appl. No.: 14/347,105

(22) PCT Filed: Sep. 5, 2012

(86) PCT No.: PCT/KR2012/007100
§ 371 (c)(1),
(2), (4) Date: Mar. 25, 2014

(87) PCT Pub. No.: WO2013/048026
PCT Pub. Date: Apr. 4, 2013

(65) Prior Publication Data
US 2014/0230734 A1    Aug. 21, 2014

(30) Foreign Application Priority Data
Sep. 27, 2011    (KR) .................. 10-2011-0097842

(51) Int. Cl.
| C23F 1/00 | (2006.01) |
| C23C 16/00 | (2006.01) |
| C23C 16/455 | (2006.01) |
| C23C 16/32 | (2006.01) |
| C23C 16/458 | (2006.01) |
| C30B 25/12 | (2006.01) |
| C30B 29/36 | (2006.01) |

(52) U.S. Cl.
CPC .......... *C23C 16/455* (2013.01); *C23C 16/325* (2013.01); *C23C 16/458* (2013.01); *C23C 16/4588* (2013.01); *C30B 25/12* (2013.01); *C30B 29/36* (2013.01)

(58) Field of Classification Search
USPC ................ 118/715, 728; 156/345.33, 345.51
See application file for complete search history.

(56) References Cited

U.S. PATENT DOCUMENTS

| 6,093,253 A | 7/2000 | Lofgren et al. |
| 2003/0049372 A1* | 3/2003 | Cook ...................... C23C 16/24 427/248.1 |
| 2003/0209719 A1 | 11/2003 | Nakamura et al. |
| 2005/0039686 A1* | 2/2005 | Zheng ............... C23C 16/45546 118/728 |
| 2007/0259110 A1* | 11/2007 | Mahajani .......... C23C 16/45508 427/248.1 |

(Continued)

FOREIGN PATENT DOCUMENTS

| JP | H09-167760 A | 6/1997 |
| JP | 2005-327995 A | 11/2005 |
| WO | WO 2011/114858 | * 9/2011 |

OTHER PUBLICATIONS

International Search Report in International Application No. PCT/KR2012/007100, filed Sep. 5, 2012.

*Primary Examiner* — Rakesh K Dhingra
(74) *Attorney, Agent, or Firm* — Saliwanchik, Lloyd & Eisenschenk

(57) ABSTRACT

Disclosed is a deposition apparatus. The deposition apparatus includes a susceptor into which reactive gas is introduced, and a wafer holder provided in the susceptor to receive a substrate or a wafer. The wafer holder comprises a gas feeding part provided at a lateral side of the wafer holder.

9 Claims, 3 Drawing Sheets

(56) References Cited

U.S. PATENT DOCUMENTS

| | | | | |
|---|---|---|---|---|
| 2008/0152803 A1* | 6/2008 | Lamouroux | .......... | C23C 16/045 427/248.1 |
| 2010/0225011 A1 | 9/2010 | Lee et al. | | |
| 2010/0275848 A1* | 11/2010 | Fukuda | ................ | C23C 16/325 118/728 |
| 2012/0231615 A1* | 9/2012 | Shiomi | ............ | C23C 16/45504 438/503 |

* cited by examiner

[Fig. 1]
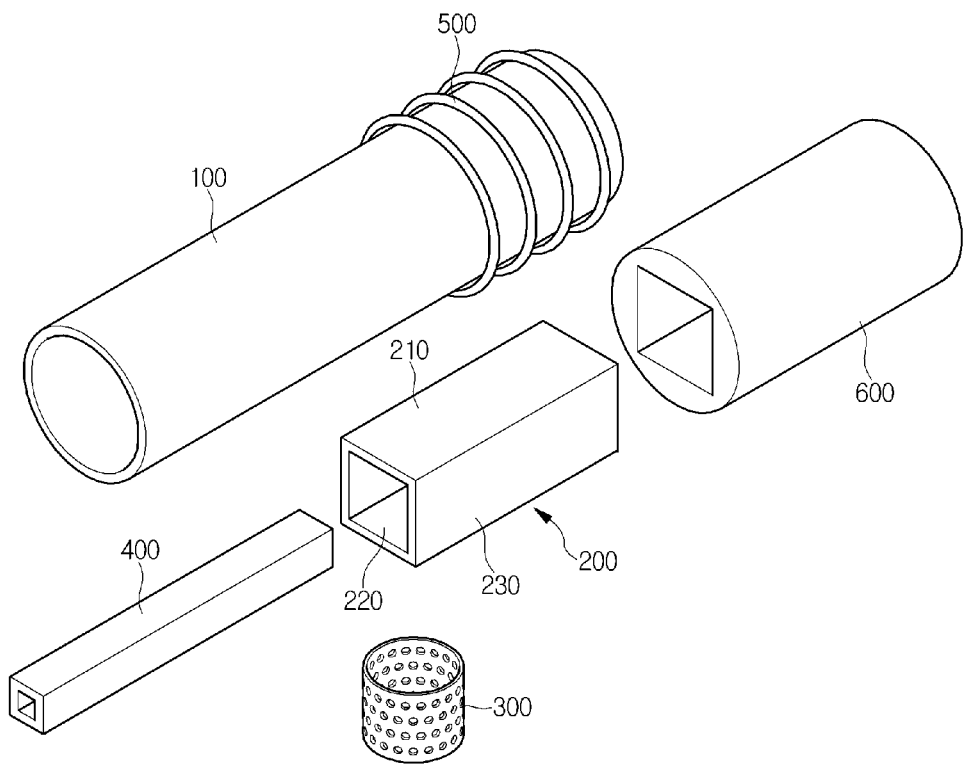
[Fig. 2]
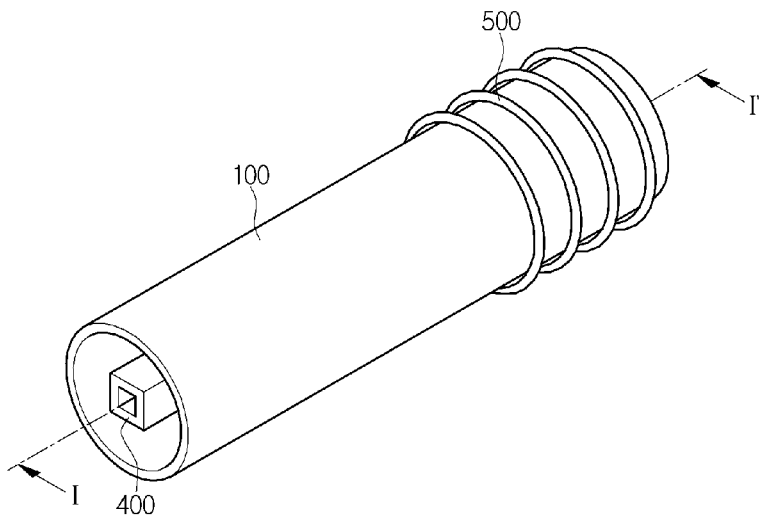

[Fig. 3]
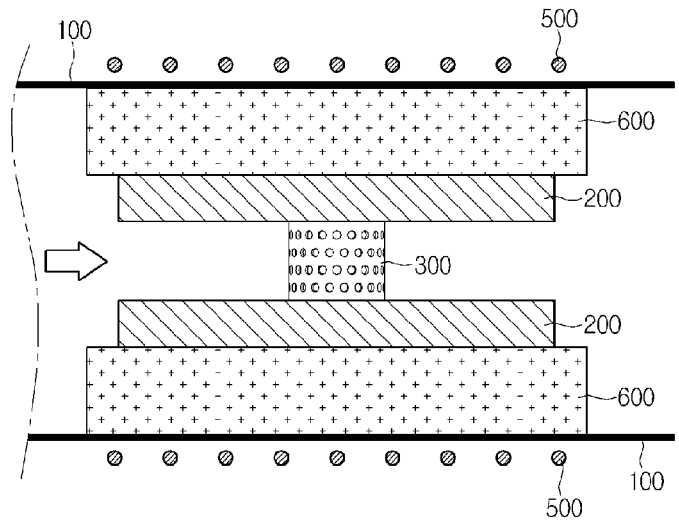
[Fig. 4]
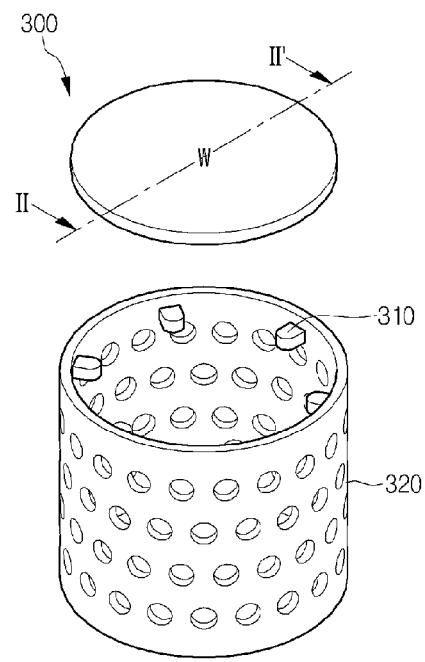
[Fig. 5]
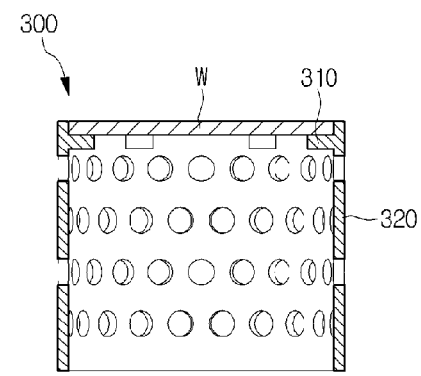

[Fig. 6]
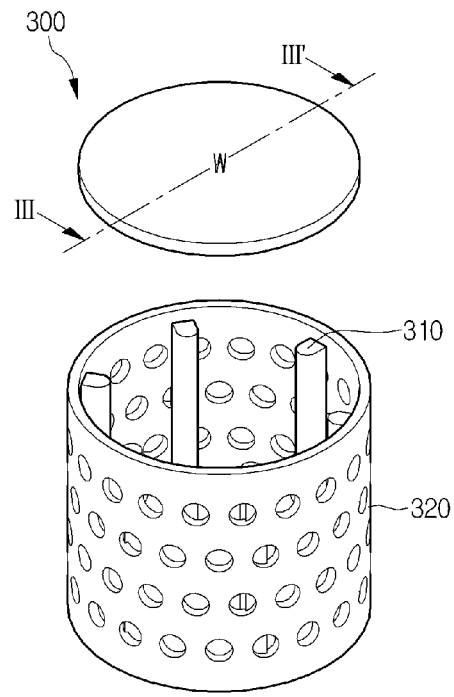
[Fig. 7]
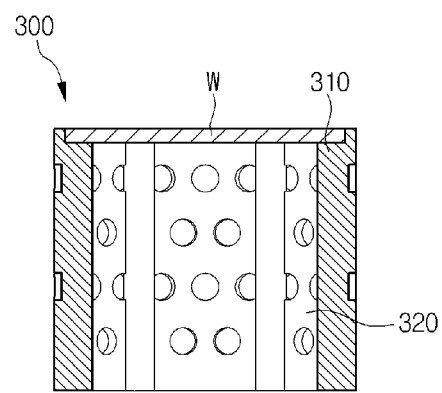

DEPOSITION APPARATUS

CROSS-REFERENCE TO RELATED APPLICATIONS

This application is the U.S. national stage application of International Patent Application No. PCT/KR2012/007100, filed Sep. 5, 2012, which claims priority to Korean Application No. 10-2011-0097842, filed Sep. 27, 2011, the disclosures of each of which are incorporated herein by reference in their entirety.

TECHNICAL FIELD

The embodiment relates to a deposition apparatus.

BACKGROUND ART

In general, among technologies to form various thin films on a substrate or a wafer, a CVD (Chemical Vapor Deposition) scheme has been extensively used. The CVD scheme results in a chemical reaction. According to the CVD scheme, a semiconductor thin film or an insulating layer is formed on a wafer surface by using the chemical reaction of a source material.

The CVD scheme and the CVD device have been spotlighted as an important thin film forming technology due to the fineness of the semiconductor device and the development of high-power and high-efficiency LED. Recently, the CVD scheme has been used to deposit various thin films, such as a silicon layer, an oxide layer, a silicon nitride layer, a silicon oxynitride layer, or a tungsten layer, on a wafer.

Hereinafter, a silicon carbide epitaxial deposition apparatus according to the related art will be described.

According to the related art, reactive gas is supplied to a deposition apparatus through a reactive gas feeding part, and the reactive gas inflowing into the deposition apparatus is introduced into a susceptor. Thereafter, as air flows through a space between upper and lower plates of the susceptor, the reactive gas introduced into the susceptor is applied to the top surface of a wafer so that a deposition process can be performed.

In this case, the wafer may be placed on the lower plate of the susceptor, or the wafer may be placed on a wafer holder after the wafer holder has been placed on the lower plate of the susceptor, so that an epitaxial layer can be grown by using the reactive gas introduced into the susceptor.

In other words, since the wafer cannot adjust the reactive gas introduced into the susceptor, the diffusion of the reactive gas cannot be smoothly achieved. In addition, since the epitaxial layer is grown upward on the top surface of the wafer, the wafer may be defected by down pull particles.

Therefore, there is required a deposition apparatus equipped with a wafer holder capable of growing an epitaxial layer on a lower surface of the wafer while smoothly diffusing reactive gas, which has been introduced into the susceptor, to the wafer.

DISCLOSURE OF INVENTION

Technical Problem

The embodiment provides a deposition apparatus capable of enhancing the reliability of a deposition process while forming a high-quality thin film.

Solution to Problem

According to the embodiment, there is provided a deposition apparatus including a susceptor into which reactive gas is introduced, and a wafer holder provided in the susceptor to receive a substrate or a wafer. The wafer holder comprises a gas feeding part provided at a lateral side of the wafer holder.

Advantageous Effects of Invention

According to the deposition apparatus of the embodiment, the reactive gas is supplied to the wafer in the susceptor through the wafer holder having a plurality of holes formed at the lateral side thereof. Accordingly, the reactive gas introduced into the susceptor is collected in the wafer holder and supplied to the wafer, so that the reactive gas can be uniformly dispersed on the wafer.

As a result, the low-temperature reactive gas serving as the main cause of the irregular temperature distribution is collected in the wafer holder provided in the susceptor, so that the temperature uniform can be improved.

In addition, the deposition apparatus according to the embodiment includes a wafer support part capable of supporting the edge of the wafer at the upper portion of the wafer holder provided in the susceptor. Accordingly, the edge of the wafer makes contact with the wafer support part, and the central area of the wafer is exposed to the reactive gas, so that the growth surface of an epitaxial layer is directed downward from the wafer, thereby reducing factors to cause the failure in the epitaxial grown.

In other words, the deposition apparatus of the embodiment can enhance the reliability of the deposition process and a high-quality thin film can be deposited.

BRIEF DESCRIPTION OF DRAWINGS

FIG. 1 is an exploded perspective view showing a deposition apparatus according to the embodiment;

FIG. 2 is a perspective view showing the deposition apparatus according to the embodiment;

FIG. 3 is a sectional view taken along line I-I of FIG. 2;

FIG. 4 is an enlarged perspective view of the wafer holder of FIG. 2 according to a first embodiment;

FIG. 5 is a sectional view of FIG. 4;

FIG. 6 is an enlarged perspective view of the wafer holder of FIG. 2 according to a second embodiment; and FIG. 7 is a sectional view of FIG. 6.

MODE FOR THE INVENTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of a layer (or film), a region, a pattern, or a structure shown in the drawings may be modified for the purpose of convenience or clarity, the thickness and the size of elements may not utterly reflect an actual size.

Hereinafter, the embodiment will be described in detail with reference to accompanying drawings.

Referring to FIGS. 1 to 7, a deposition apparatus according to the embodiment may include a susceptor into which reactive gas is introduced, and a wafer holder to receive a substrate or a wafer provided in the susceptor. The wafer holder may include a gas feeding part provided at a lateral side of the wafer holder.

In addition, according to the deposition apparatus of the embodiment, the wafer holder may further include a wafer support part making contact with the edge of the substrate or the wafer.

FIG. 1 is an exploded perspective view showing a deposition apparatus according to the embodiment, FIG. 2 is a perspective view showing the deposition apparatus, and FIG. 3 is a sectional view taken along line I-I' of FIG. 2. FIG. 4 is an enlarged perspective view of the wafer holder of FIG. 2 according to the embodiment, FIG. 5 is a sectional view taken along line II-II' of FIG. 4, and FIG. 6 is an enlarged perspective view of the wafer holder according to another embodiment. FIG. 7 is a sectional view taken along line III-III' of FIG. 6.

Referring to FIGS. 1 to 3, the deposition apparatus according to the embodiment includes a chamber 100, a susceptor 200, a source gas guide part 400, a wafer holder 300, and an induction coil 500.

The chamber 100 may have the shape of a cylindrical tube. In addition, the chamber 100 may have the shape of a rectangular box. The chamber 100 may include the susceptor 200, the source gas line 400, and the wafer holder 300. Although not shown in drawings, the chamber 100 may be additionally provided at one side thereof with a gas inlet allowing precursors to be introduced and a gas outlet allowing gas discharge.

Further, both end portions of the chamber 100 are closed, and the chamber 10 may prevent the introduction of external gas and maintain the degree of vacuum. The chamber 100 may include quartz representing high mechanical strength and superior chemical durability. Further, the chamber 100 represents an improved heat resistance property.

In addition, an adiabatic part 600 may be further provided in the chamber 100. The adiabatic part 600 may preserve heat in the chamber 100. A material constituting the adiabatic part 600 may include nitride ceramic, carbide ceramic, or graphite.

The susceptor 200 is provided in the chamber 100. The susceptor 200 receives the source gas guide part 400 and the wafer holder 300. In addition, the susceptor 200 includes a substrate such as the wafer W. In addition, the reactive gas is introduced into the susceptor 200 through the source gas line 400.

As shown in FIG. 1, the susceptor 200 may include a susceptor upper plate 210, a susceptor lower plate 220, and susceptor lateral plates 230. In addition, the susceptor upper and lower plates 210 and 220 face each other.

The susceptor 200 may be manufactured by placing the susceptor upper and lower plates 210 and 220, placing the susceptor lateral plates 230 and 240 at both sides of the susceptor upper and lower plates 210 and 220, and bonding the susceptor upper and lower plates 210 and 220 with the susceptor lateral plates 230 and 240.

However, the embodiment is not limited thereto. For instance, a space for a gas passage can be made in the rectangular parallelepiped susceptor 200.

The susceptor 200 includes graphite representing a high heat resistance property and a superior workability, so that the susceptor 200 can endure under the high temperature condition. Further, the susceptor 200 may have a structure in which a graphite body is coated with silicon carbide. Meanwhile, the susceptor 200 may be induction-heated.

Reactive gas supplied from the susceptor 200 is decomposed into radical by heat, and then the radical may be deposited on the wafer W. For example, the reactive gas may be introduced together with methyltrichlorosilane (MTS) or silane and ethylene gas. The MTS is decomposed into radical including silicon or carbon, so that a silicon carbide epitaxial layer may be grown on the wafer W. In more detail, the radical may include $CH_3$., $CH_4$, $SiCl_3$., or $SiCl_2$..

The wafer holder 300 may be additionally provided on the susceptor lower plate 220.

Hereinafter, the wafer holder 300 will be described in detail with reference to FIGS. 4 to 7.

Referring to FIGS. 4 to 7, the wafer holder 300 according to the embodiment may have a cylindrical shape having an open upper portion. In addition, the wafer holder 300 may have a rectangular box shape having an open upper portion.

In addition, referring to FIGS. 4 to 7, the wafer holder 300 may include a body 320 and a wafer support part 310 formed at an upper end portion of the wafer holder 300. As shown in FIGS. 6 and 7, the wafer support part 310 may be formed in the shape of a column or a rod on the body 320. The wafer support part 310 may support the edge of the wafer placed on the upper end of the wafer holder 300. In other words, the wafer support part 310 may support the wafer while making contact with the whole edge area of the wafer.

In addition, as shown in FIGS. 4 and 5, the wafer support part 310 may include a plurality of protrusion parts protruding inward from the upper end of the wafer holder 300. The protrusion parts support a portion of the edge areas of the wafer so that the wafer may be placed on the upper end of the wafer holder 300.

The height of the wafer holder 300 may be equal to the height between the susceptor upper plate 210 and the susceptor lower plate 220.

In addition, a plurality of gas feeding parts may be provided at a lateral side of the body of the wafer holder 300. Preferably, the gas feeding parts may include a plurality of gas holes.

The wafer holder 300 provided in the susceptor 200 collects the reactive gas introduced into the susceptor 200 into the wafer holder 300. In other words, since the height of the wafer holder 300 is equal to the height between the susceptor upper plate 210 and the susceptor lower plate 220, and a plurality of gas holes are formed, the reactive gas can be collected into the wafer holder 300 having the cylindrical box or the rectangular box through a plurality of gas holes formed in the wafer holder 300.

Accordingly, the wafer may be provided on the upper end part of the wafer holder by the wafer support part 310, and the reactive gas may be collected into the wafer holder 300 having the cylindrical shape or the rectangular shape through the gas holes formed in the wafer holder 300, so that the epitaxial layer can be grown on the bottom surface of the wafer by the collected reactive gas. In other words, the wafer may make a growth surface of an epitaxial layer directed downward from the wafer.

According to the related part, the wafer holder is provided on the lower plate of the susceptor, and air flows through the space between the upper and lower plates of the susceptor, so that the deposition process can be performed. In other words, according to the related art, the epitaxial layer is grown in such a manner that the growth surface of the epitaxial layer is directed upward. Therefore, the defects may be caused by down pull particles.

In addition, according to the related art, when the reactive gas is introduced into the susceptor, the reactive gas is irregularly dispersed, so that the epitaxial layer may be irregularly grown on the wafer.

In contrast, according to the deposition apparatus of the embodiment, the wafer holder 300 provided in the susceptor 200 may collect the reactive gas, which is introduced into the susceptor 200, through a plurality of gas holes formed in the wafer holder 300. In addition, the wafer may be provided at the upper end of the wafer holder 300 through the wafer support part.

Therefore, the reactive gas may be uniformly transmitted into the wafer, and the growth surface of the silicon carbide epitaxial layer is directed downward, thereby removing down full particles to cause the defects of the epitaxial layer. Therefore, the reliability of the deposition process can be increased, and the high-quality thin film can be deposited.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A deposition apparatus comprising:
a susceptor into which a reactive gas is introduced, wherein the susceptor includes a susceptor upper plate and a susceptor lower plate facing the susceptor upper plate; and
a wafer holder disposed between the susceptor upper plate and susceptor lower plate to receive a substrate or a wafer, such that a height of the wafer holder is equal to a height between the susceptor upper plate and the susceptor lower plate,
wherein the wafer holder includes a plurality of holes as a gas feeding part, provided at a lateral side of the wafer holder,
wherein the wafer holder further comprises a plurality of wafer support parts making contact with an edge area of the substrate or the wafer,
wherein each wafer support part is a protrusion protruding inward from a periphery of the wafer holder,
wherein the substrate or the wafer is disposed on the wafer support parts within an upper part of the wafer holder,
wherein the reactive gas is introduced to the wafer holder through the gas feeding part,
wherein a distance between the susceptor upper plate and the gas feeding part is greater than a distance between the susceptor upper plate and the plurality of wafer support parts,
wherein a distance between the susceptor upper plate and the wafer support parts corresponds to a thickness of the substrate or the wafer,
wherein an epitaxial layer is formed on the substrate or the wafer inside the wafer holder by the introduced reactive gas.

2. The deposition apparatus of claim 1, wherein each wafer support part is formed in a shape of a column or a rod in the wafer holder.

3. The deposition apparatus of claim 1, wherein a shape of the wafer holder comprises a cylindrical shape or a rectangular shape having an open upper portion.

4. The deposition apparatus of claim 1, wherein the wafer or the substrate includes silicon carbide.

5. The deposition apparatus of claim 1, wherein the reactive gas includes carbon and silicon.

6. The deposition apparatus of claim 1, wherein the deposition apparatus forms a silicon carbide epitaxial layer on the wafer or the substrate.

7. The deposition apparatus of claim 1, wherein the susceptor comprises graphite and is coated with silicon carbide.

8. The deposition apparatus of claim 1, wherein the epitaxial layer is formed on a lower surface of the substrate or the wafer, and wherein the lower surface of the substrate or the wafer faces the susceptor lower plate.

9. The deposition apparatus of claim 1, wherein the epitaxial layer is formed on a central area of the substrate or the wafer.

* * * * *